(12) United States Patent
Liu et al.

(10) Patent No.: US 8,728,851 B2
(45) Date of Patent: May 20, 2014

(54) METHOD OF MANUFACTURING SOLAR CELL WITH UPPER AND LOWER CONDUCTOR LAYERS STACKED TOGETHER

(75) Inventors: Sheng Yung Liu, Taoyuan County (TW); Chin-Tien Yang, Hsinchu County (TW); Chun-Hung Lin, Taipei (TW)

(73) Assignee: Big Sun Energy Technology Inc., Hsinchu County (TW)

( * ) Notice: Subject to any disclaimer, the term of this patent is extended or adjusted under 35 U.S.C. 154(b) by 79 days.

(21) Appl. No.: 13/549,877

(22) Filed: Jul. 16, 2012

(65) Prior Publication Data

US 2012/0282724 A1 Nov. 8, 2012

Related U.S. Application Data

(62) Division of application No. 12/100,786, filed on Apr. 10, 2008, now Pat. No. 8,253,010.

(30) Foreign Application Priority Data

Nov. 23, 2007 (TW) ................................ 96144384 A
Dec. 19, 2007 (TW) ................................ 96148566 A

(51) Int. Cl.
*H01L 31/18* (2006.01)
(52) U.S. Cl.
USPC .................................... 438/72; 257/E31.119
(58) Field of Classification Search
None
See application file for complete search history.

(56) References Cited

U.S. PATENT DOCUMENTS

| | | | |
|---|---|---|---|
| 4,160,678 A | 7/1979 | Jain et al. | |
| 4,620,058 A | 10/1986 | Winterling et al. | |
| 4,694,115 A | 9/1987 | Lillington et al. | |
| 5,591,565 A | 1/1997 | Holdermann et al. | |
| 5,726,065 A | 3/1998 | Szlufcik et al. | |
| 8,253,010 B2* | 8/2012 | Liu et al. | 136/256 |
| 8,253,014 B2* | 8/2012 | Liu et al. | 136/256 |
| 2006/0231800 A1 | 10/2006 | Wang et al. | |

FOREIGN PATENT DOCUMENTS

TW  200735388  9/2007

* cited by examiner

*Primary Examiner* — Seahvosh Nikmanesh
(74) *Attorney, Agent, or Firm* — Muncy, Geissler, Olds & Lowe, P.C.

(57) ABSTRACT

A method of manufacturing a solar cell comprises the steps of: forming a lower conductor layer on a front side of a substrate; firing the lower conductor layer at a first temperature to form a first portion embedded into a doped region of the substrate and a second portion; forming an anti-reflection coating (ARC) layer on the front side and the second portion, wherein the ARC layer covers the lower conductor layer such that the second portion is disposed in the ARC layer; forming an upper conductor layer, corresponding to the lower conductor layer and electrically connected to the lower conductor layer, on the ARC layer; and firing the upper conductor layer at a second temperature to form a first portion embedded into the ARC layer and a second portion, which is exposed out of the ARC layer.

12 Claims, 4 Drawing Sheets

METHOD OF MANUFACTURING SOLAR CELL WITH UPPER AND LOWER CONDUCTOR LAYERS STACKED TOGETHER

CROSS-REFERENCES TO RELATED APPLICATION

The present invention is a divisional application of the U.S. application Ser. No. 12/100,786, filed on Apr. 10, 2008 and now issued as U.S. Pat. No. 8,253,010.

BACKGROUND OF THE INVENTION

1. Field of Invention

The invention relates to a solar cell and a method of manufacturing the same, and more particularly to a solar cell formed by one screen printing process, one firing process and one grinding process, or formed by two screen printing processes and two firing processes, and a method of manufacturing the same.

2. Related Art

A solar cell is an opto-electronic element for converting solar energy into electric energy. The solar cell is also referred to as a photovoltaic battery from the physical point of view.

The conventional solar cell is manufactured by providing a silicon substrate, and forming an anti-reflection coating (ARC) layer on the silicon substrate by way of chemical vapor deposition (CVD), such as plasma enhanced CVD (PECVD), and then the screen printing and co-firing processes are performed to form finger electrodes on the ARC layer. According to this manufacturing method, the co-firing temperature has to be very high so that the manufacturing cost cannot be decreased and the manufacturing time cannot be shortened.

Alternatively, after the ARC layer is formed, windows may be formed by way of etching, and then the silver paste is filled into the windows by way of screen printing so that the finger electrodes can be formed. According to this manufacturing method, the very high precision alignment is required. That is, the silver paste has to be precisely filled into the windows during the screen printing process. In order to solve the problem of alignment, the trade-off between the sizes of the windows and the efficiency of the solar cell has to be considered.

Therefore, it is an important subject of the invention to provide a solar cell, which is free from encountering the problem of alignment, and a method of manufacturing the solar cell with the lowered firing temperature.

SUMMARY OF THE INVENTION

It is therefore an object of the invention to provide a solar cell and a method of manufacturing the same, wherein the solar cell is manufacturing by one screen printing process, one firing process and one grinding process.

Another object of the invention is to provide a solar cell and a method of manufacturing the same, wherein the solar cell is manufacturing by two screen printing processes and two firing processes.

The invention achieves the above-identified objects by providing a solar cell including a substrate, a conductor layer and an anti-reflection coating (ARC) layer. The substrate has a front side, a back side and a doped region adjacent to the front side. The conductor layer has a first portion embedded into the doped region and a second portion other than the first portion. The anti-reflection coating (ARC) layer is disposed on the front side of the substrate. The second portion of the conductor layer is disposed in the ARC layer, the conductor layer has an exposed surface exposed out of the ARC layer, and the exposed surface of the conductor layer is substantially flush with an exposed surface of the ARC layer.

The invention also provides a method of manufacturing a solar cell. The method includes the steps of: providing a substrate having a front side, a back side and a doped region adjacent to the front side; forming a conductor layer on the front side of the substrate; firing the conductor layer at a temperature such that the conductor layer is formed with a first portion embedded into the doped region and a second portion other than the first portion; forming an anti-reflection coating (ARC) layer on the front side of the substrate and the second portion of the conductor layer, wherein the ARC layer covers the conductor layer so that the second portion of the conductor layer is disposed in the ARC layer; and removing the ARC layer on the conductor layer so that the conductor layer has an exposed surface exposed out of the ARC layer, wherein the exposed surface of the conductor layer is substantially flush with an exposed surface of the ARC layer.

The invention further provides a solar cell including a substrate, a lower conductor layer, an anti-reflection coating (ARC) layer and an upper conductor layer. The substrate has a front side, a back side and a doped region adjacent to the front side. The lower conductor layer has a first portion embedded into the doped region and a second portion other than the first portion. The anti-reflection coating (ARC) layer is disposed on the front side of the substrate and covers the lower conductor layer such that the second portion of the lower conductor layer is disposed in the ARC layer. The upper conductor layer has a first portion embedded into the ARC layer and a second portion other than the first portion of the upper conductor layer. The second portion of the upper conductor layer is exposed out of the ARC layer, and the upper conductor layer is electrically connected to the lower conductor layer.

The invention further provides a method of manufacturing a solar cell. The method includes the steps of: providing a substrate having a front side, a back side and a doped region adjacent to the front side; forming a lower conductor layer on the front side of the substrate; firing the lower conductor layer at a first temperature such that the lower conductor layer is formed with a first portion embedded into the doped region and a second portion other than the first portion; forming an anti-reflection coating (ARC) layer on the front side of the substrate and the second portion of the lower conductor layer, wherein the ARC layer covers the lower conductor layer such that the second portion of the lower conductor layer is disposed in the ARC layer; forming an upper conductor layer, which corresponds to the lower conductor layer, on the ARC layer; and firing the upper conductor layer at a second temperature such that the upper conductor layer is formed with a first portion embedded into the ARC layer and a second portion other than the first portion of the upper conductor layer, wherein the second portion of the upper conductor layer is exposed out of the ARC layer, and the upper conductor layer is electrically connected to the lower conductor layer.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
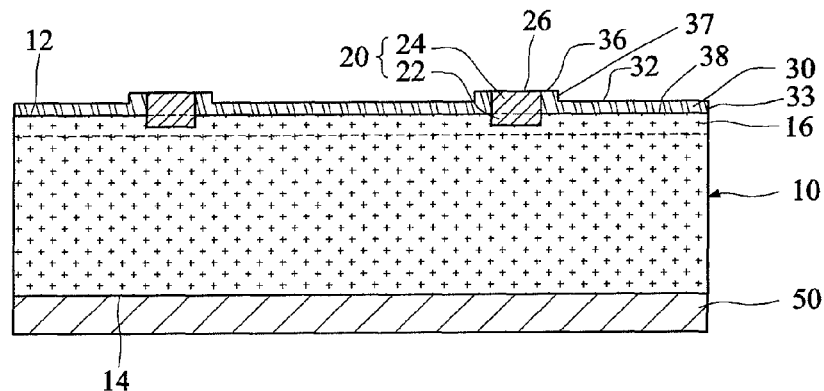
FIG. 1 is a schematically cross-sectional view showing a solar cell according to a first preferred embodiment of the invention.

FIG. 1 is a schematically cross-sectional view showing a solar cell according to a first preferred embodiment of the invention. Referring to FIG. 1, the solar cell of this embodiment includes a substrate 10, a conductor layer 20 and an ARC layer 30.

In this embodiment, the substrate 10 is a silicon substrate, and may also be any other suitable substrate. The substrate 10 has a front side 12, a back side 14 and a doped region 16 adjacent to the front side 12. It is to be noted that another doped region (not shown) may also be formed adjacent to the back side 14.

The conductor layer 20 has a first portion 22 embedded into the doped region 16 and a second portion 24 other than the first portion 22. The conductor layer 20 is usually made of silver, or may also be made of any other suitable metal material. The conductor layer 20 is in Ohmic contact with the doped region 16. The conductor layer 20 has a thickness ranging from 20 to 30 microns.

The ARC layer 30 is disposed on the front side 12 of the substrate 10. In detail, the ARC layer 30 has a first exposed surface 36, a second exposed surface 32, a first side surface 37, a second side surface 33 and a bottom surface 38. The first side surface 37 is connected to the first exposed surface 36 and the second exposed surface 32, the second side surface 33 is connected to the second exposed surface 32 and the bottom surface 38, and the bottom surface 38 of the ARC layer 30 is disposed on the front side 12 of the substrate 10. The first portion 22 of the conductor layer 20 has a bottom surface 26B. The second portion 24 of the conductor layer 20 is disposed in the ARC layer 30. The second portion 24 of the conductor layer 20 has an exposed surface 26, which is exposed out of the ARC layer 30 and the substrate 10, and is disposed opposite the bottom surface 26B of the first portion 22 of the conductor layer 20. The exposed surface 26 of the conductor layer 20 is substantially flush with the first exposed surface 36 of the ARC layer 30. In this embodiment, the exposed surface 26 of the conductor layer 20 is higher than the second exposed surface 32 of the ARC layer 30 and the bottom surface 26B of the first portion 22 of the conductor layer 20. That is, the first exposed surface 36 and the second exposed surface 32 of the ARC layer 30 are disposed at different levels. The bottom surface 26B of the first portion 22 of the conductor layer 20 is lower than the bottom surface 38 of the ARC layer 30. The material of the ARC layer 30 includes silicon nitride ($Si_3N_4$), titanium dioxide ($TiO_2$), silicon dioxide ($SiO_2$), magnesium fluoride (MgF2), aluminum oxide ($Al_2O_3$), cerium oxide ($CeO_2$) or tantalum pentoxide ($Ta_2O_5$).

In addition, the solar cell of this embodiment may further include a backside electrode layer 50 disposed on the back side 14 of the substrate 10. The backside electrode layer 50 may be formed with several exposed silver electrodes.

FIGS. 2 to 6 are schematically cross-sectional views showing structures corresponding to various steps of a method of manufacturing the solar cell according to the first embodiment of the invention. Referring to FIGS. 2 to 6, the method of manufacturing the solar cell of the invention includes the following steps.

Figure 2:
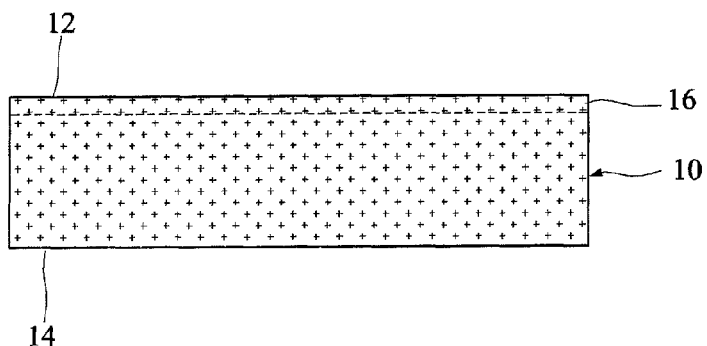
FIGS. 2 to 6 are schematically cross-sectional views showing structures corresponding to various steps of a method of manufacturing the solar cell according to the first embodiment of the invention.

First, as shown in FIG. 2, a substrate 10 is provided. The substrate 10 has a front side 12, a back side 14 and a doped region 16 adjacent to the front side 12.

Figure 3:
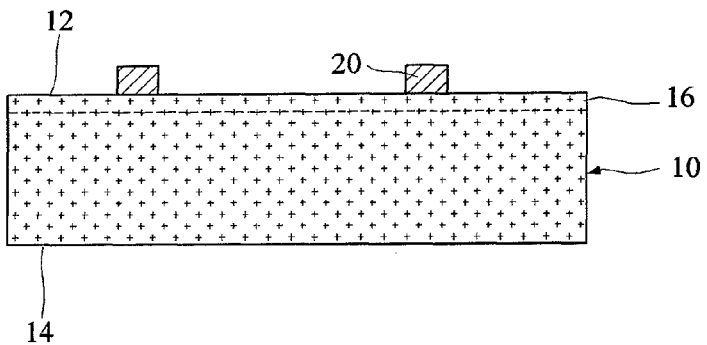

Next, as shown in FIG. 3, a conductor layer 20 is formed on the front side 12 of the substrate 10. For example, the conductor layer 20 may be formed by way of screen printing or injection printing.

Figure 4:
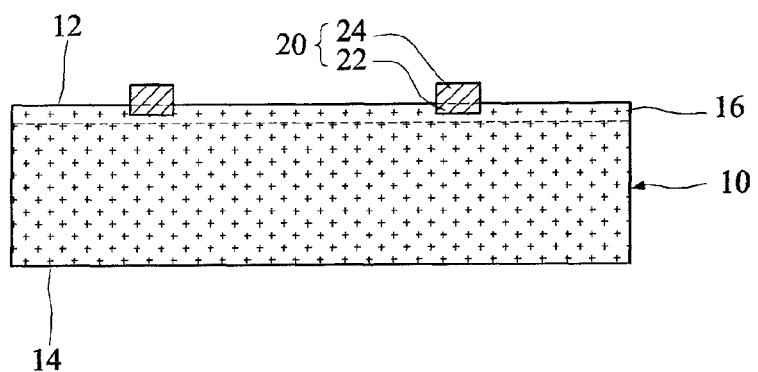

Then, as shown in FIG. 4, the conductor layer 20 is fired at a temperature so that the conductor layer 20 is formed with a first portion 22 embedded into the doped region 16 and a second portion 24 other than the first portion 22. The temperature is about 830° C., which is lower than the conventional co-firing temperature (about 850° C.).

Figure 5:
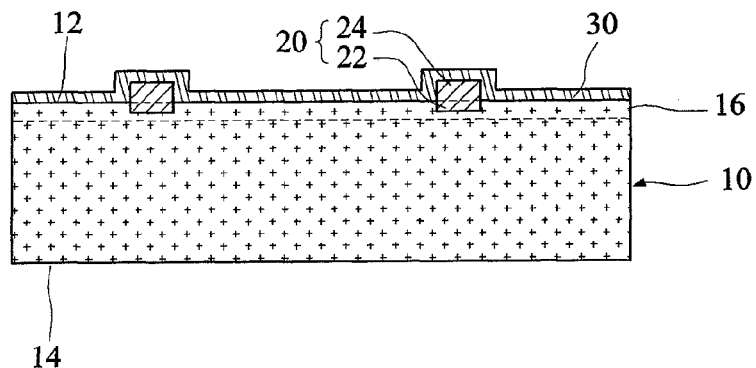

Next, as shown in FIG. 5, an ARC layer 30 is formed on the front side 12 of the substrate 10 and the second portion 24 of the conductor layer 20. The ARC layer 30 covers the conductor layer 20 such that the second portion 24 of the conductor layer 20 is disposed in the ARC layer 30. The ARC layer 30 is formed by way of sputtering, spin coating or CVD, such as PECVD.

Figure 6:
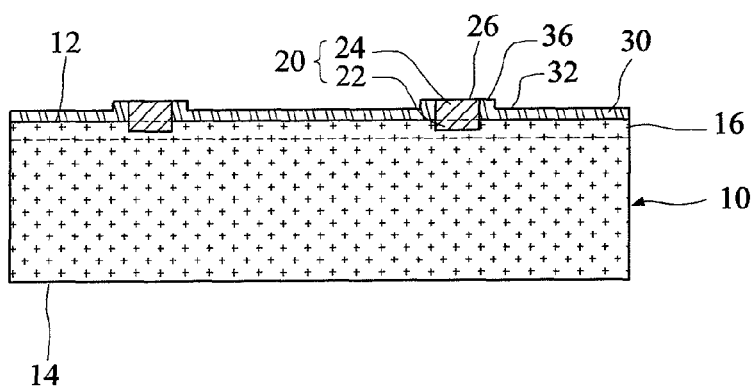

Then, as shown in FIG. 6, the ARC layer 30 on the conductor layer 20 is removed such that the conductor layer 20 has an exposed surface 26 exposed out of the ARC layer 30. The exposed surface 26 of the conductor layer 20 is substantially flush with a first exposed surface 36 of the ARC layer 30. In this embodiment, the exposed surface 26 of the conductor layer 20 is higher than a second exposed surface 32 of the ARC layer 30.

Next, the method of the invention may further include the step of forming a backside electrode layer 50 on the back side 14 of the substrate 10, as shown in FIG. 1. The backside electrode layer 50 may be formed after the step of FIG. 6, or before or after the step of FIG. 2.

The other details have been described in the illustration of the structure of FIG. 1, so detailed descriptions thereof will be omitted.

Figure 7:
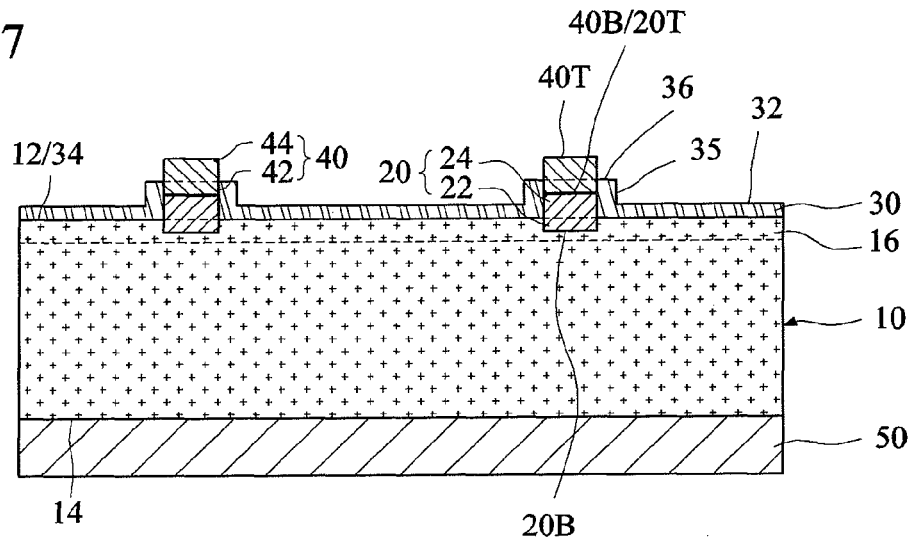
FIG. 7 is a schematically cross-sectional view showing a solar cell according to a second preferred embodiment of the invention.

FIG. 7 is a schematically cross-sectional view showing a solar cell according to a second preferred embodiment of the invention. Referring to FIG. 7, the solar cell of this embodiment includes a substrate 10, a lower conductor layer 20, an ARC layer 30 and an upper conductor layer 40.

In this embodiment, the substrate 10 is a silicon substrate, and may also be any other suitable substrate. The substrate 10 has a front side 12, a back side 14 and a doped region 16 adjacent to the front side 12.

The lower conductor layer 20 has a top surface 20T, a bottom surface 20B, a first portion 22 embedded into the doped region 16 and a second portion 24 other than the first portion 22. The lower conductor layer 20 is usually made of silver, or may also be made of any other suitable metal material. The lower conductor layer 20 is in Ohmic contact with the doped region 16 and has a thickness ranging from 20 to 30 microns.

The ARC layer 30 has a first exposed surface 36, a second exposed surface 32, a third exposed surface 35 connecting the first exposed surface 36 to the second exposed surface 32, and a bottom surface 34 in direct contact with the front side 12 of the substrate 10, and is disposed on the front side 12 of the substrate 10 and covers the lower conductor layer 20 such that the second portion 24 of the lower conductor layer 20 is disposed in the ARC layer 30. The material of the ARC layer 30 includes silicon nitride.

The upper conductor layer 40 has a top surface 40T, a bottom surface 40B in direct contact with the top surface 20T of the lower conductor layer 20, a first portion 42 embedded into the ARC layer 30 and a second portion 44 other than the first portion 42. The second portion 44 of the upper conductor layer 40 is exposed out of the ARC layer 30, and the upper conductor layer 40 is electrically connected to the lower conductor layer 20. The upper conductor layer 40 is usually made of silver or any other suitable metal material. In this embodiment, the top surface 40T of the upper conductor layer 40 is higher than the first exposed surface 36 of the ARC layer 30, the first exposed surface 36 of the ARC layer 30 is higher than the second exposed surface 32 of the ARC layer 30 and the bottom surface 40B of the upper conductor layer 40, the top surface 20T of the lower conductor layer 20 is higher than the bottom surface 34 of the ARC layer 30, and the bottom surface 34 of the ARC layer 30 is higher than the bottom surface 20B of the lower conductor layer 20.

In addition, the solar cell of this embodiment may further include a backside electrode layer 50 disposed on the back side 14 of the substrate 10. The backside electrode layer 50 may be formed with several exposed silver electrodes.

FIGS. 8 to 13 are schematically cross-sectional views showing structures corresponding to various steps of a method of manufacturing the solar cell according to the second embodiment of the invention. Referring to FIGS. 8 to 13, the method of manufacturing the solar cell of the invention includes the following steps.

Figure 8:
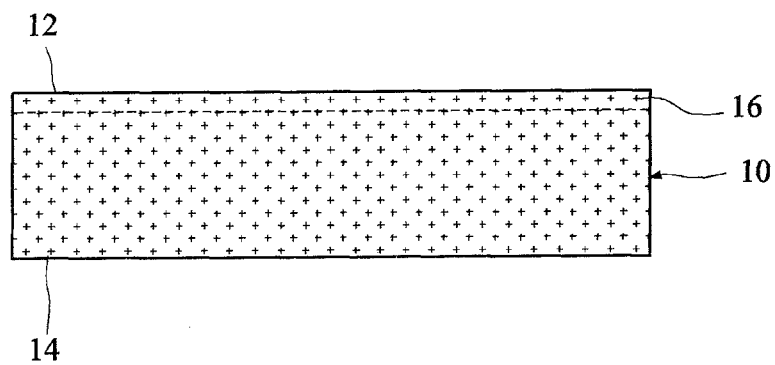
FIGS. 8 to 13 are schematically cross-sectional views showing structures corresponding to various steps of a method of manufacturing the solar cell according to the second embodiment of the invention.

First, as shown in FIG. 8, a substrate 10 is provided. The substrate 10 has a front side 12, a back side 14 and a doped region 16 adjacent to the front side 12.

Figure 9:
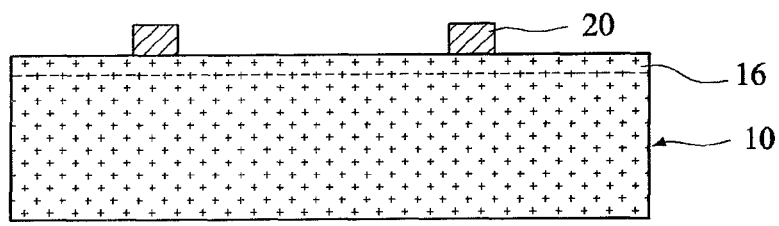

Next, as shown in FIG. 9, a lower conductor layer 20 is formed on the front side 12 of the substrate 10. For example, the lower conductor layer 20 may be formed by way of screen printing or injection printing.

Figure 10:
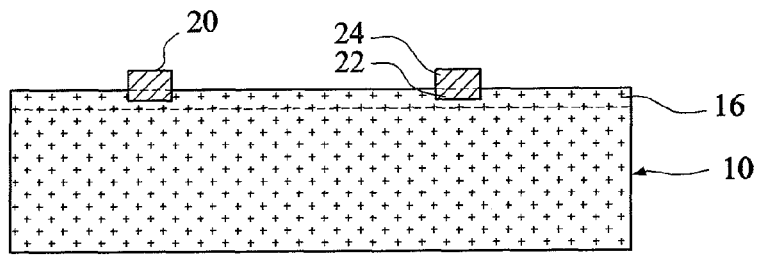

Then, as shown in FIG. 10, the lower conductor layer 20 is fired at a first temperature so that the lower conductor layer 20 is formed with a first portion 22 embedded into the doped region 16 and a second portion 24 other than the first portion 22.

Figure 11:
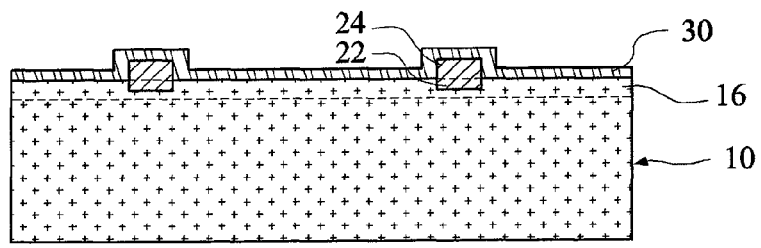

Next, as shown in FIG. 11, an ARC layer 30 is formed on the front side 12 of the substrate 10 and the second portion 24 of the lower conductor layer 20. The ARC layer 30 covers the lower conductor layer 20 such that the second portion 24 of the lower conductor layer 20 is disposed in the ARC layer 30. The ARC layer 30 is formed by way of sputtering, spin coating or CVD, such as PECVD.

Figure 12:
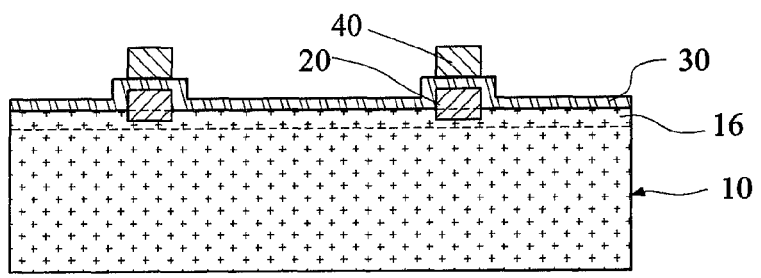

Then, as shown in FIG. 12, an upper conductor layer 40 corresponding to the lower conductor layer 20 is formed on the ARC layer 30. For example, it is possible to form the upper conductor layer 40 by way of the screen printing or injection printing.

Figure 13:
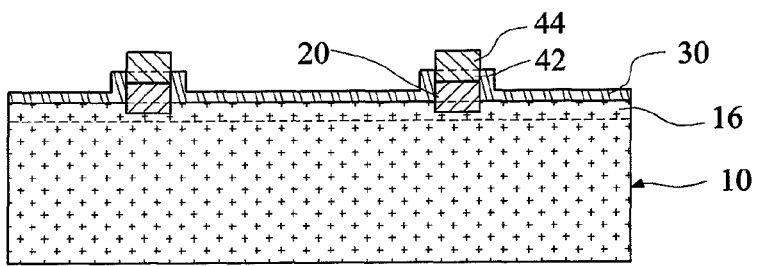

Next, as shown in FIG. 13, the upper conductor layer 40 is fired at a second temperature so that the upper conductor layer 40 is formed with a first portion 42 embedded into the ARC layer 30 and a second portion 44 other than the first portion 42. The second portion 44 of the upper conductor layer 40 is exposed out of the ARC layer 30, and the upper conductor layer 40 is electrically connected to the lower conductor layer 20. The second temperature is about 830° C., and the first temperature is about 190° C. The second temperature is higher than the first temperature but is lower than the conventional co-firing temperature (about 850° C.).

Next, the method of the invention may further include the step of forming a backside electrode layer 50 on the back side 14 of the substrate 10, as shown in FIG. 7. The backside electrode layer 50 may be formed after the step of FIG. 13, or before or after the step of FIG. 8.

The other details have been described in the illustration of the structure of FIG. 7, so detailed descriptions thereof will be omitted.

According to the solar cells and its manufacturing methods of the invention, it is possible to avoid the conventional problem of alignment, and the conventional problem of the high co-firing temperature.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A method of manufacturing a solar cell, the method comprising the steps of:
   providing a substrate having a front side, a back side and a doped region adjacent to the front side;
   forming a lower conductor layer on the front side of the substrate;
   firing the lower conductor layer at a first temperature such that the lower conductor layer is formed with a first portion embedded into the doped region and a second portion other than the first portion;
   forming an anti-reflection coating (ARC) layer on the front side of the substrate and the second portion of the lower conductor layer, wherein the ARC layer covers the lower conductor layer such that the second portion of the lower conductor layer is disposed in the ARC layer;
   forming an upper conductor layer, which corresponds to the lower conductor layer, on the ARC layer; and
   firing the upper conductor layer at a second temperature such that the upper conductor layer is formed with a first portion embedded into the ARC layer and a second portion other than the first portion of the upper conductor layer, wherein the second portion of the upper conductor layer is exposed out of the ARC layer, and the upper conductor layer is electrically connected to the lower conductor layer.

2. The method according to claim 1, further comprising the step of:
   forming a backside electrode layer on the back side of the substrate.

3. The method according to claim 1, wherein the lower conductor layer is formed by way of screen printing or injection printing.

4. The method according to claim 1, wherein the second temperature is higher than the first temperature.

5. The method according to claim 1, wherein the ARC layer is formed by way of chemical vapor deposition (CVD), sputtering or spin coating.

6. The method according to claim 1, wherein the upper conductor layer is formed by way of screen printing or injection printing.

7. The method according to claim 1, wherein the substrate is a silicon substrate.

8. The method according to claim 1, wherein a material of the ARC layer comprises silicon nitride.

9. The method according to claim 1, wherein both of the upper and lower conductor layers are made of silver.

10. The method according to claim 1, wherein the lower conductor layer is in Ohmic contact with the doped region.

11. The method according to claim 1, wherein a thickness of the lower conductor layer ranges from 20 to 30 microns.

12. The method according to claim 1, wherein the second temperature is lower than 850° C.

* * * * *